United States Patent
Xiong et al.

(10) Patent No.: US 10,631,420 B1
(45) Date of Patent: Apr. 21, 2020

(54) HOUSING, METHOD FOR MANUFACTURING SAME, AND ELECTRONIC DEVICE USING SAME

(71) Applicants: SHENZHEN FUTAIHONG PRECISION INDUSTRY CO., LTD., Shenzhen (CN); FIH (HONG KONG) LIMITED, Kowloon (HK)

(72) Inventors: Yi Xiong, Shenzhen (CN); Wei Deng, Shenzhen (CN); Kun-Hua Chen, Kowloon (HK); Jin-Hua Li, Shenzhen (CN)

(73) Assignees: SHENZHEN FUTAHONG PRECISION INDUSTRY CO., LTD., Shenzhen (CN); FIH (HONG KONG) LIMITED, Kowloon (HK)

( * ) Notice: Subject to any disclaimer, the term of this patent is extended or adjusted under 35 U.S.C. 154(b) by 0 days.

(21) Appl. No.: 16/245,458

(22) Filed: Jan. 11, 2019

(30) Foreign Application Priority Data

Dec. 11, 2018 (CN) .......................... 2018 1 1513833

(51) Int. Cl.
*H05K 5/04* (2006.01)
*H05K 5/00* (2006.01)
*H05K 5/02* (2006.01)
*H05K 7/14* (2006.01)
*H05K 7/18* (2006.01)

(52) U.S. Cl.
CPC ............. *H05K 5/04* (2013.01); *H05K 5/0017* (2013.01); *H05K 5/0217* (2013.01); *H05K 7/1452* (2013.01); *H05K 7/18* (2013.01)

(58) Field of Classification Search
CPC .......... H05K 5/04; H05K 7/18; H05K 7/1452; H05K 5/0017; H05K 5/0217
See application file for complete search history.

(56) References Cited

U.S. PATENT DOCUMENTS

| | | | |
|---|---|---|---|
| 2014/0284096 A1* | 9/2014 | Wu | H05K 5/04 174/520 |
| 2016/0072932 A1* | 3/2016 | Hill | H04M 1/0249 455/575.1 |
| 2017/0078460 A1* | 3/2017 | Lee | H04M 1/0249 |
| 2018/0070465 A1* | 3/2018 | Cater | G06F 1/1626 |

FOREIGN PATENT DOCUMENTS

TW 275947 U 5/1996

* cited by examiner

*Primary Examiner* — Abhishek M Rathod
(74) *Attorney, Agent, or Firm* — ScienBiziP, P.C.

(57) ABSTRACT

A housing of metal combined with plastic used for an electronic device includes a metal frame and a plastic connecting member. The metal frame comprises a middle frame portion, an inner surface of the middle frame portion forming at least one metal rib. The plastic connecting member comprises a plastic base portion formed on one side surface of the metal rib, and the plastic base portion and the metal rib together form a reinforcing bar to greatly increase a strength of the finished housing.

7 Claims, 7 Drawing Sheets

300

301
Providing a metal frame, the metal frame comprises a middle frame portion, wherein an inner surface of the middle frame portion forms at least one metal rib

302
Forming a plastic connecting member with the metal frame, and wherein the plastic connecting member at least comprises a plastic base portion formed on one side surface of the metal rib, the plastic base portion and the metal rib together form a reinforcing bar to enhance a strength of the housing

FIG. 7

HOUSING, METHOD FOR MANUFACTURING SAME, AND ELECTRONIC DEVICE USING SAME

FIELD

The subject matter herein generally relates to housings and casings for electronic devices.

BACKGROUND

Metal housing used in electronic device has good appearance, mechanical strength, and heat dissipation and more and more manufacturers design electronic devices with metal housing to meet the needs of consumers. Metal housing formed by CNC technology have excess material removed from a raw metal block with a larger thickness to obtain a final product. Raw metal block is expensive and CNC processing time is long, which leads to increase of product cost.

Therefore, there is room for improvement within the art.

BRIEF DESCRIPTION OF THE DRAWINGS

Implementations of the present technology will now be described, by way of embodiments only, with reference to the attached figures.

FIG. 7 is a flowchart of a manufacturing method for the housing in FIG. 2.

DETAILED DESCRIPTION

Figure 1:
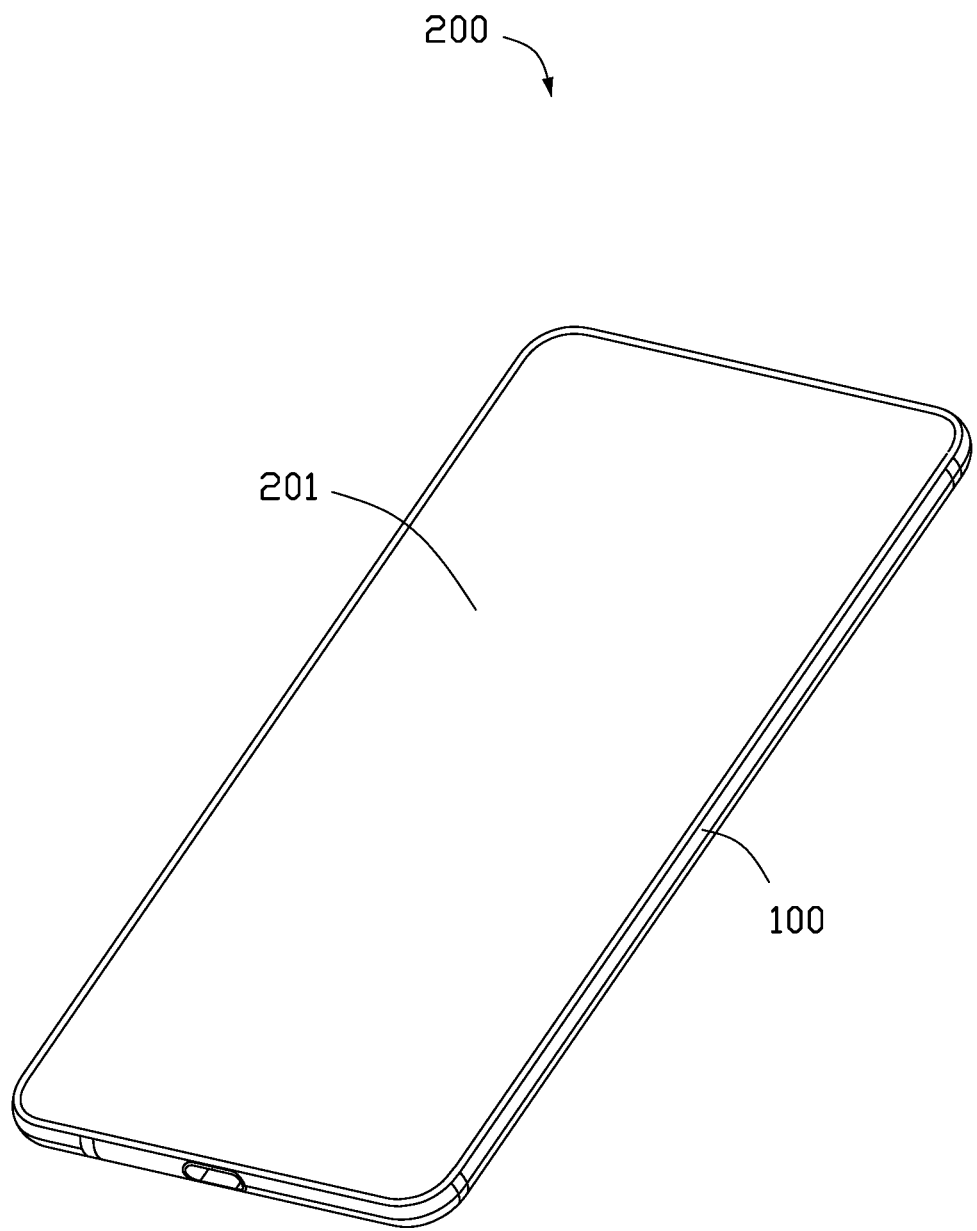
FIG. 1 is an isometric view of an electronic device in accordance with one embodiment.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts may be exaggerated to illustrate details and features of the present disclosure better. The disclosure is illustrated by way of embodiments and not by way of limitation in the figures of the accompanying drawings, in which like references indicate similar elements. It should be noted that references to "an" or "one" embodiment in this disclosure are not necessarily to the same embodiment, and such references mean "at least one."

Several definitions that apply throughout this disclosure will now be presented.

The term "substantially" is defined to be essentially conforming to the particular dimension, shape, or other feature that the term modifies, such that the component need not be exact. For example, "substantially cylindrical" means that the object resembles a cylinder, but can have one or more deviations from a true cylinder. The term "comprising," when utilized, means "including, but not necessarily limited to"; it specifically indicates open-ended inclusion or membership in the so-described combination, group, series, and the like. The references "a plurality of" and "a number of" mean "at least two."

FIG. 1 illustrates a housing 100 adapted for an electronic device 200. The electronic device 200 may be, but is not limited to, mobile phone, PDA (Personal Digital Assistant), tablet, digital camera, etc. The electronic device 200 includes, but is not limited to, a housing 100 and a display screen 201 detachably assembled in the housing 100. The electronic device 200 may further include, but is not limited to, other mechanical structures, electronic components, module, and software to perform predefined functions.

In the embodiment, the housing 100 is an external casing of the electronic device 200. The housing 100 includes a metal frame 10 and a plastic connecting member 20 which is injection molded to the metal frame 10. The metal frame 10 can be formed by casting, stamping, or by computer numerical control (CNC) process. A material of the metal frame 10 is selected from a group consisting of stainless steel, aluminum, magnesium, titanium, copper, and any combination thereof.

Figure 4:
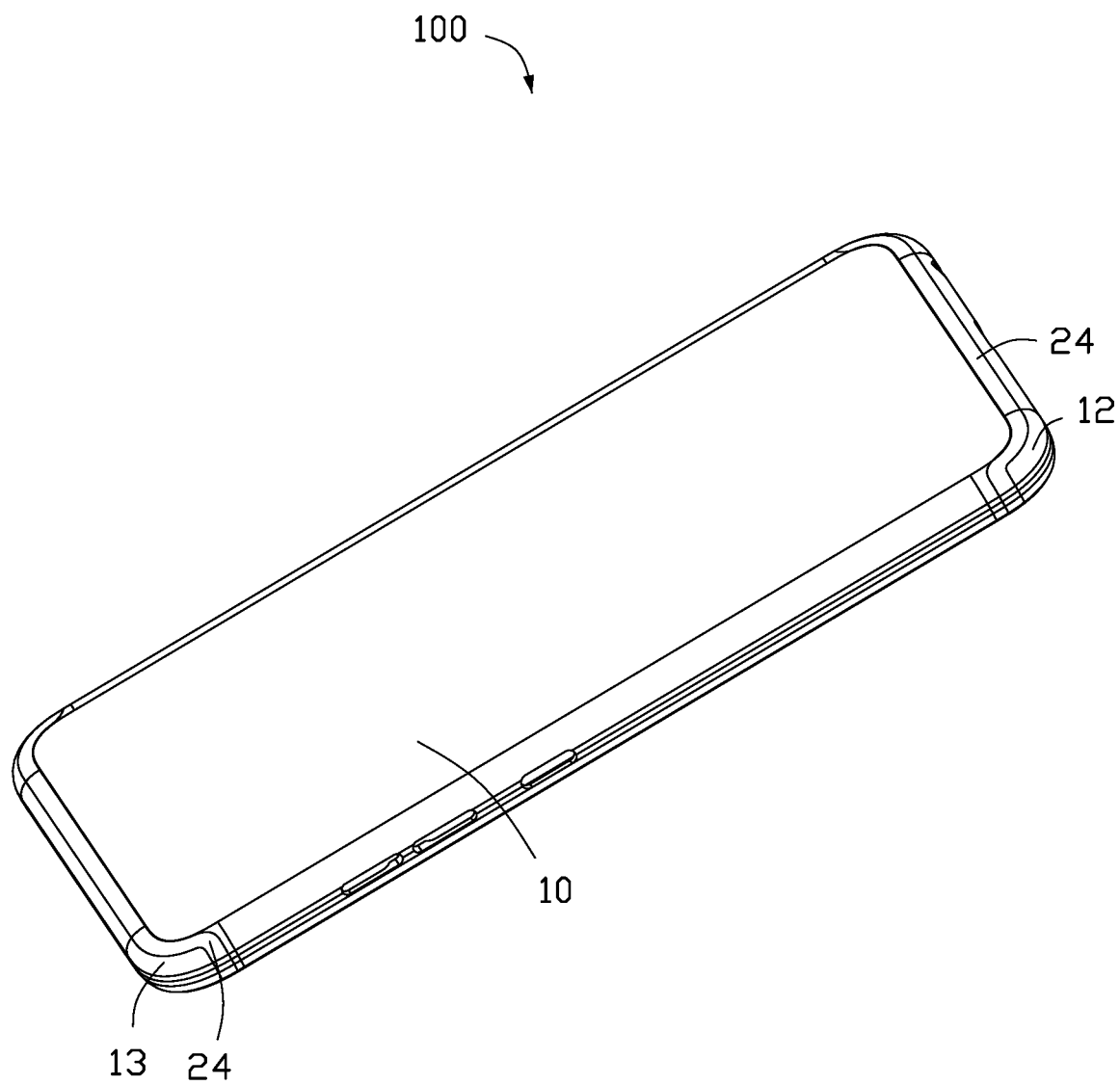
FIG. 4 is another isometric view of a metal frame in the housing in FIG. 2.
Figure 5:
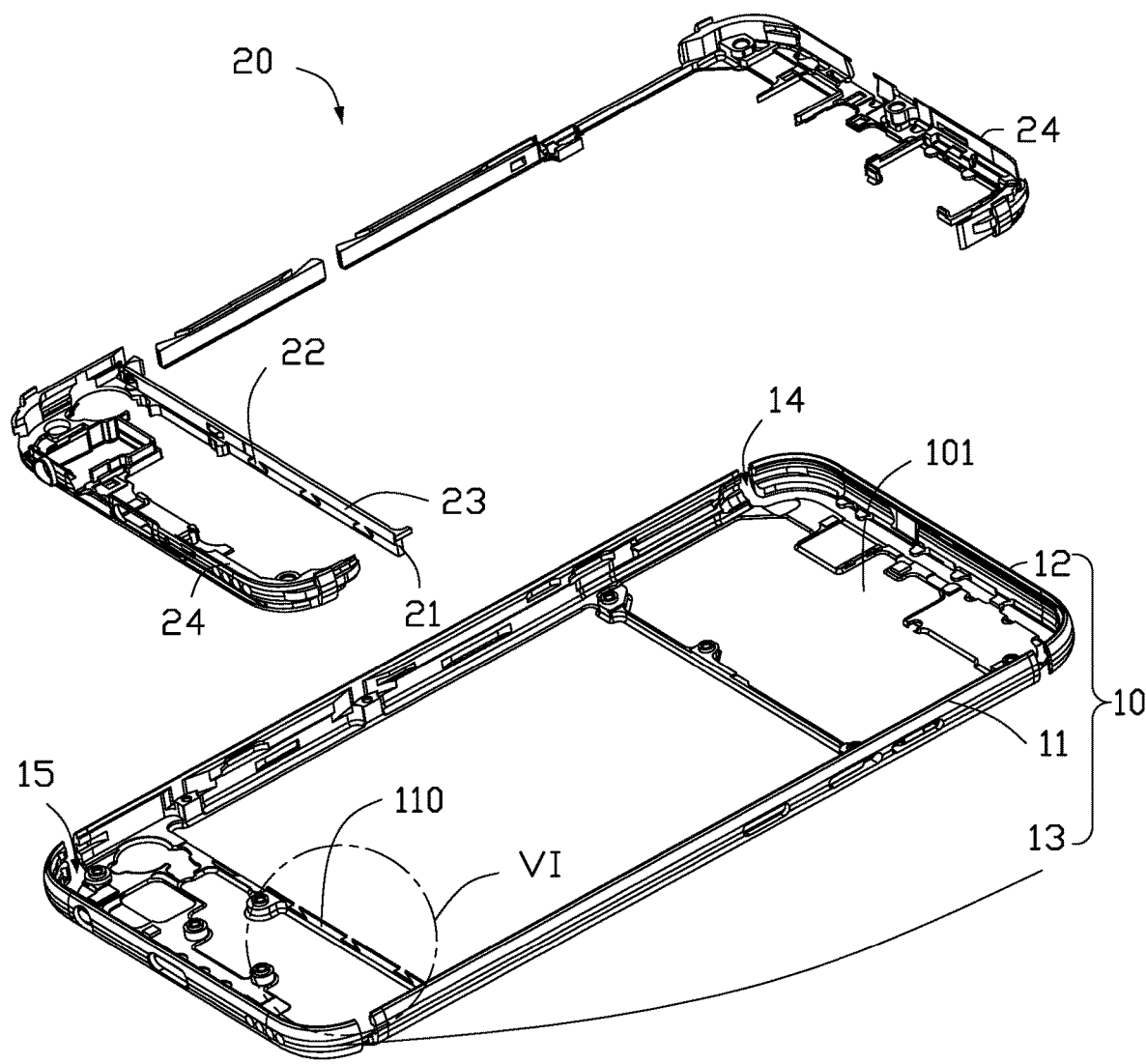
FIG. 5 is an exploded view of the housing of FIG. 2.

In the embodiment, the metal frame 10 is substantially a rectangular structure and includes a middle frame portion 11, a first metal portions 12, and a second metal portion 13. The middle frame portion 11 is substantially a rectangular plate-shaped structure. The first metal portion 12 is a U-shape. The second metal portion 13 is an inverted U-shape. The middle frame portion 11 is located between the first metal portion 12 and the second metal portion 13, the first metal portion 12 and the second metal portion 13 locate at opposite ends of the middle frame portion 11. A first gap 14 is formed between the middle frame portion 11 and the first metal portion 12. A second gap 15 is formed between the middle frame portion 11 and the second metal portion 13. The first gap 14 and the second gap 15 are roughly U-shaped, as shown in FIG. 4.

Figure 2:
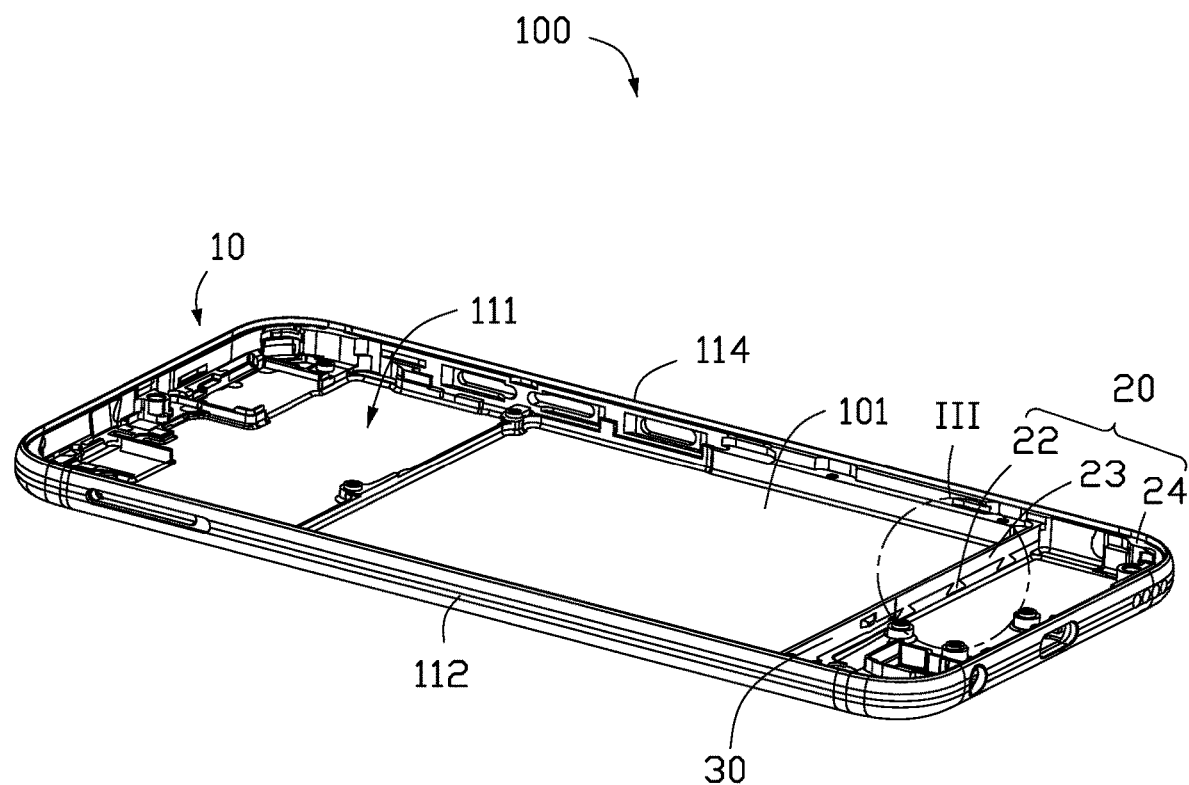
FIG. 2 is an isometric view of a housing of the electronic device in FIG. 1.

As shown in FIG. 2, the middle frame portion 11 includes a first side wall 112 and a second side wall 114 parallel to the first side wall 112, both the first side wall 112 and the second side wall 114 extend along a length direction of the metal frame 10. The inner surface 101 of the middle frame portion 11 is formed with at least one metal rib 110. Ends of the metal rib 110 are perpendicularly connected to the first side wall 112 and the second side wall 114. In the embodiment, a number of the metal ribs 110 is one. The metal rib 110 includes at least one glue grabbing groove 115, as shown in FIG. 3.

Figure 6:
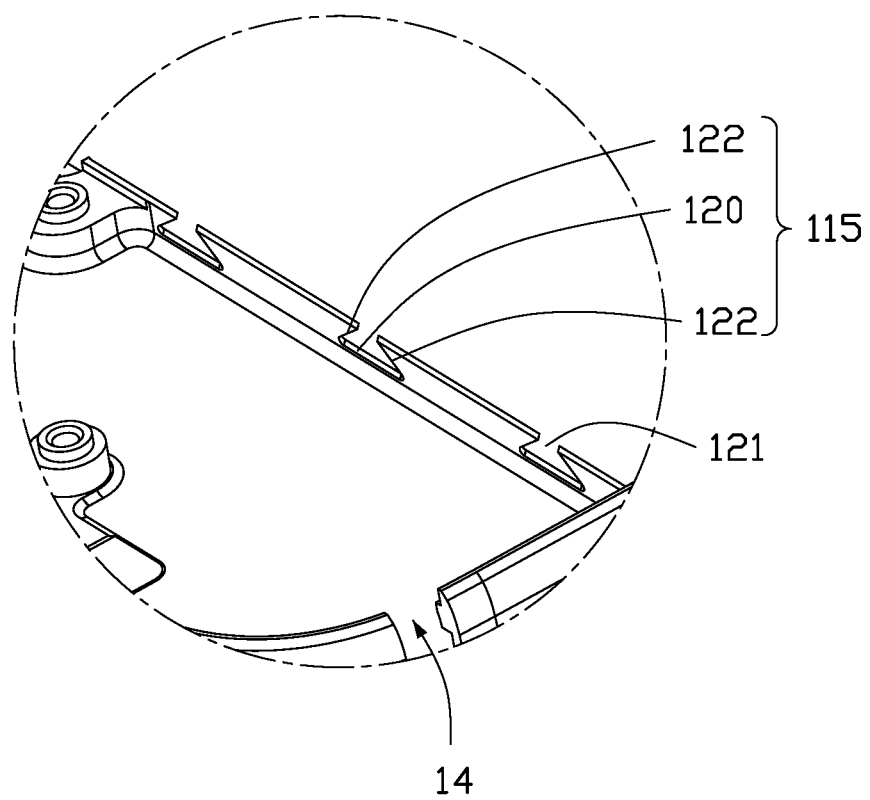
FIG. 6 is a view of circled area VI of FIG. 5.

The glue grabbing groove 115 includes a groove bottom 120 and two side edges 122, as shown in FIG. 6. The two side edges 122 incline from the groove bottom 120 towards each other so that the size of the opening 121 of the glue grabbing groove 115 is smaller than the size of the groove bottom 120. The opening 121 is smaller than the bottom 120 so that molten plastic material can be locked in the glue grabbing groove 115. In the embodiment, the metal rib 110 includes three glue grabbing grooves 115 at intervals. The size of the glue grabbing groove 115 can be set according to demand.

Figure 3:
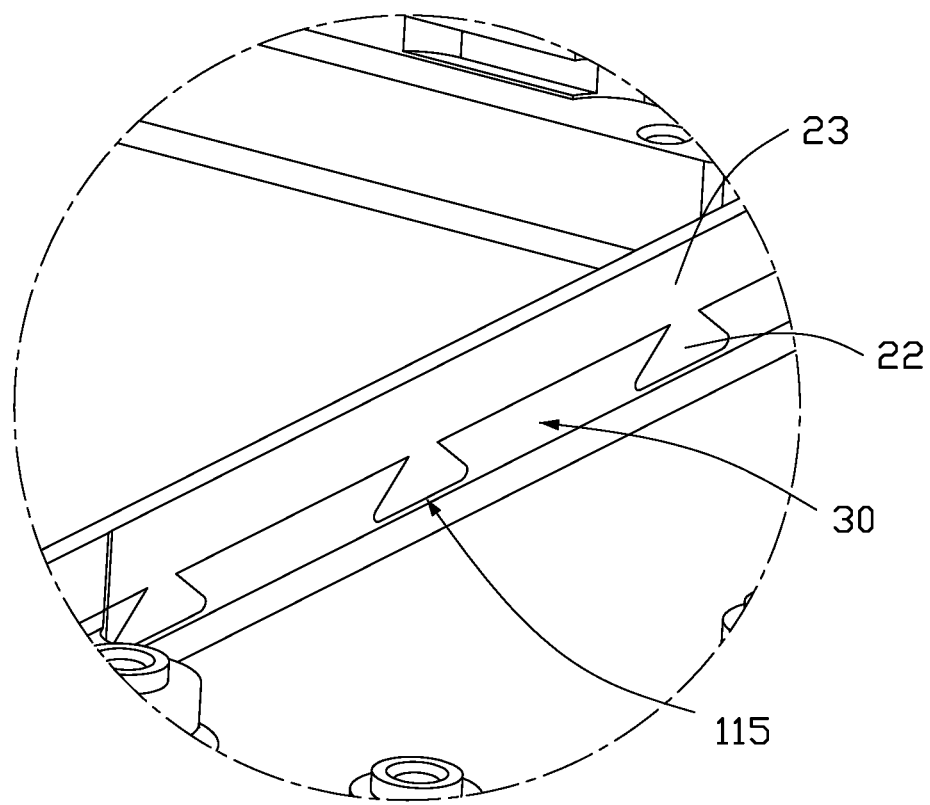
FIG. 3 is a view of circled area III of FIG. 2.

As shown in FIGS. 2-3, the plastic connecting member 20 includes a plastic base portion 21 formed on one of side of the metal rib 110, a plastic filling portion 22 infilled in each glue grabbing groove 115, a plastic connection portion 23 formed on the top of the metal rib 110, and plastic jointing portions 24 infilling the first gap 14 and the second gap 15. The plastic jointing portions 24 also infill the side wall of the middle frame portion 11. The plastic base portion 21 has a same length as the metal rib 110. The plastic base portion 21 supports and tightly attaches to the metal rib 110. The metal rib 110, together with the plastic base portion 21, forms a reinforcing bar 30 which enhances the strength of the housing 100.

The plastic base portion 21 and the metal rib 110 together form a reinforcing bar 30 of the metal frame 10. Thus, a thickness of the raw material used to form the metal frame 10 can be reduced, and the unit price of the raw material can be reduced. In addition, the raw material can be thinner, and the CNC processing time is reduced, thereby product unit price is greatly reduced. In the embodiment, a thickness of the metal frame 10 is about 3.00 mm, a thickness of the raw material for forming the metal frame 10 only needs to be 3.00 mm.

Each glue grabbing groove 115 is infilled with a plastic filling portion 22, and a shape of the plastic filling portion 22 is substantially trapezoidal. The glue grabbing groove 115 is able to lock the plastic filling portion 22, to prevent the plastic base portion 21 from being stripped from the metal rib 110. The plastic connecting member 20 is also prevented from being stripped from the metal frame 10. The glue grabbing groove 115 is used to lock the filling piece 22, and prevent the plastic base portion 21 from being stripped from the metal rib 110.

In the embodiment, the plastic connection portion 23 is formed on the top of the metal rib 110. A total height of the metal rib 110 and the plastic connection portion 23 is less than or equal to a height of the metal frame 10. A total thickness of the plastic base portion 21 and the metal rib 110 is equal to a thickness of the plastic connection portion 23. The plastic connection portion 23 reinforces the structural strength required by the reinforcement bar 30 and further reduces the use of metal raw material.

The plastic jointing portions 24 fill the first gap 14 and the second gap 15 so that the middle frame portion 11, the first metal portion 12, and the second metal portion 13 are combined to form the metal frame 10. The plastic jointing portion 24 may be also formed at a circumference of the metal frame 10 for further strengthening the metal frame 10.

A material of the plastic connecting member 20 has a good compatibility with the metal frame 10. In the embodiment, a material of the plastic connecting member 20 is selected from thermoplastic or thermosetting plastics. Thermoplastic plastic is selected from the group consisting of polybutylene terephthalate (PBT), polyphenylene sulfide (PPS), poly (ethylene terephthalate) (PET), polyether ketone (PEEK), polycarbonate (PC), and polyvinyl chloride (PVC). Thermosetting plastics is selected from epoxy resin, polyurea resin, or UV adhesive. The UV adhesive is acrylic resin or polyurethane.

FIG. 7 illustrates a method for manufacturing the housing 100 according to one embodiment. The method 300 is provided by way of embodiment as there are a variety of ways to carry out the method. The method 300 can begin at block 301.

At block 301, a metal frame 10 is provided. The metal frame 10 is formed by casting, stamping, or by CNC machining process.

In the embodiment, the metal frame 10 is substantially a rectangular structure and includes a middle frame portion 11, a first metal portions 12, and a second metal portion 13.

The middle frame portion 11 is substantially a rectangular plate-shaped structure. The first metal portion 12 is U-shaped. The second metal portion 13 is an inverted U-shape. The middle frame portion 11 is located between the first metal portion 12 and the second metal portion 13, the first metal portion 12 and the second metal portion 13 are located at opposite ends of the middle frame portion 11. A first gap 14 is formed between the middle frame portion 11 and the first metal portion 12. A second gap 15 is formed between the middle frame portion 11 and the second metal portion 13. The first gap 14 and the second gap 15 are roughly U-shaped structures.

At least one metal rib 110 is formed on the inner surface 101 of the middle frame portion 11. The middle frame portion 11 of the metal frame 10 includes a first side wall 112 and a second side wall 114 parallel to the first side wall 112. Both the first side wall 112 and the second side wall 114 extend along a length direction of the metal frame 10. Ends of the metal rib 110 are perpendicularly connected to the first side wall 112 and the second side wall 114. The metal rib 110 includes at least one glue grabbing groove 115.

The glue grabbing groove 115 includes a groove bottom 120 and two side edges 122, and the two side edges 122 incline from the groove bottom 120 towards each other so that the size of the opening 121 of the glue grabbing groove 115 is smaller than the size of the groove bottom 120. The opening 121 is smaller than the bottom 120 so that molten plastic material can be locked in the glue grabbing groove 115. In the embodiment, the metal rib 110 includes three glue grabbing grooves 115 at intervals.

The metal rib 110 is formed by laser cutting or by CNC process. In the embodiment, the metal rib 110 16 is formed by CNC machining.

At block 302, the plastic connecting member 20 is formed with the metal frame 10 using an injection molding method. Specifically, the metal frame 10 is placed in an injection mold cavity, and the molten plastic is injected into the injection mold cavity. A plastic base portion 21 is thus formed on one side surface of the metal rib 110, a plastic filling portion 22 is filled into each glue grabbing groove 115, a plastic connection portion 23 is formed on top of the metal rib 110, and plastic jointing portions 24 are infilled into the first gap 14 and the second gap 15. The plastic connecting member 20 is formed with the metal frame 10 using an injection molding method. The plastic connecting member 20 and the metal frame 10 thus have a strong bonding force to prevent the plastic connecting member 20 separating from the metal frame 10.

A material of the plastic connecting member 20 is selected from thermoplastic or thermosetting plastics. Thermoplastic plastics is selected from the group consisting of PBT, PPS, poly PET, PEEK, PC, and PVC. Thermosetting plastics is selected from epoxy resin, polyurea resin, or UV adhesive. The UV adhesive is acrylic resin or polyurethane.

The plastic connecting member 20 may be formed by general injection molding, or by nano injection molding technology (NMT). The NMT treatment may be as follows: a surface treatment is applied to the metal frame 10 to form nano-holes (not shown) on the inner surface of the metal frame 10, the surface treatment may be electrochemical etching treatment, impregnation treatment, anodizing, or chemical etching. Then, the metal frame 10 is placed in an injection mold cavity and the molten plastic is injected into the injection mold cavity. The plastic connecting member 20 is thus bonded with the metal frame 10.

The housing 100 forms at least one metal rib 110 on the inner surface 101 of the metal frame 10 by CNC process.

Plastic is applied in the metal frame 10 to form a plastic base portion 21 at one of the sides of the metal rib 110, the metal rib 110 and the plastic base portion 21 together form a reinforcing bar 30. The reinforcing bar 30 enhances strength of the housing 100. The plastic base portion 21 being configured to increase the structural strength of the metal rib 110 means that a thickness of a raw metal block for forming the metal frame 10 can thereby be reduced, the processing time of the metal frame 10 can also be shortened, and the cost is also reduced.

The embodiments shown and described above are only examples. Therefore, many commonly-known features and details are neither shown nor described. Even though numerous characteristics and advantages of the present technology have been set forth in the foregoing description, together with details of the structure and function of the present disclosure, the disclosure is illustrative only, and changes may be made in the detail, including in matters of shape, size, and arrangement of the parts within the principles of the present disclosure, up to and including the full extent established by the broad general meaning of the terms used in the claims. It will, therefore, be appreciated that the embodiments described above may be modified within the scope of the claims.

What is claimed is:

1. A housing adapted for an electronic device comprising:
a metal frame; and
a plastic connecting member;
wherein the metal frame comprises a middle frame portion, wherein an inner surface of the middle frame portion forms at least one metal rib, the plastic connecting member comprises a plastic base portion formed on a side surface of the metal rib, the plastic base portion and the metal rib form a reinforcing bar to enhance a strength of the housing,
wherein: the metal rib comprises at least one glue grabbing groove, the plastic connecting member further comprises a plastic filling portion filled in the at least one glue grabbing groove;
wherein: the at least one glue grabbing groove is substantially trapezoidal and comprises a groove bottom and two side edges, and the two side edges incline from the groove bottom towards each other, and a size of the opening of the glue grabbing groove is smaller than a size of the groove bottom;
wherein: the plastic connecting member further comprises a plastic connection portion formed on too of the metal rib, a total height of the metal rib and the plastic connection portion is less than or equal to a height of the metal frame; and
wherein: a total thickness of the plastic base portion and the metal rib is equal to a thickness of the plastic connection portion.

2. The housing of claim 1, wherein: the metal frame further comprises a first metal portions, and a second metal portion, the first metal portion is U-shaped, the second metal portion is an inverted U-shaped, the middle frame portion is located between the first metal portion and the second metal portion, the first metal portion and the second metal portion are located at two opposite ends of the middle frame portion.

3. The housing of claim 2, wherein:
a first gap is formed between the middle frame portion and the first metal portion, and a second gap is formed between the middle frame portion and the second metal portion.

4. The housing of claim 3, wherein:
the plastic connecting member further comprises plastic jointing portions infilled in the first gap and the second gap.

5. The housing of claim 1, wherein:
the reinforcing bar protrudes from the inner surface of the middle frame portion.

6. An electronic device comprising:
a display screen and a housing, and the display screen is detachably assembled in the housing,
wherein the housing comprises a metal frame and a plastic connecting member;
the metal frame comprises a middle frame portion, wherein an inner surface of the middle frame portion forms at least one metal rib, the plastic connecting member comprises a plastic base portion formed on one side surface of the metal rib, the plastic base portion and the metal rib together form a reinforcing bar to enhance a strength of the housing;
wherein: the metal rib comprises at least one glue grabbing groove, the plastic connecting member further comprises a plastic filling portion filled in the at least one glue grabbing groove;
wherein: the at least one glue grabbing groove is substantially trapezoidal and comprises a groove bottom and two side edges, and the two side edges incline from the groove bottom towards each other, and a size of the opening of the glue grabbing groove is smaller than a size of the groove bottom;
wherein: the plastic connecting member further comprises a plastic connection portion formed on too of the metal rib, a total height of the metal rib and the plastic connection portion is less than or equal to a height of the metal frame; and
wherein: a total thickness of the plastic base portion and the metal rib is equal to a thickness of the plastic connection portion.

7. The housing of claim 6, wherein: the reinforcing bar protrudes from the inner surface of the middle frame portion.

* * * * *